United States Patent
Kato et al.

(10) Patent No.: US 7,718,898 B2
(45) Date of Patent: May 18, 2010

(54) PRECURSOR FOR MANUFACTURING $Nb_3Sn$ SUPERCONDUCTING WIRE AND $Nb_3Sn$ SUPERCONDUCTING WIRE

(75) Inventors: Hiroyuki Kato, Kobe (JP); Takayuki Miyatake, Kobe (JP); Takayoshi Miyazaki, Kobe (JP); Kyoji Zaitsu, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 405 days.

(21) Appl. No.: 11/703,165

(22) Filed: Feb. 7, 2007

(65) Prior Publication Data

US 2007/0186998 A1 Aug. 16, 2007

(30) Foreign Application Priority Data

Feb. 10, 2006 (JP) .............................. 2006-033349

(51) Int. Cl.
*H01B 12/10* (2006.01)

(52) U.S. Cl. .................. 174/125.1; 505/887; 420/901; 428/662; 148/98; 29/599

(58) Field of Classification Search .................. None
See application file for complete search history.

(56) References Cited

U.S. PATENT DOCUMENTS

| 5,167,061 | A | * | 12/1992 | Ozeryansky | 29/599 |
| 2002/0006527 | A1 | * | 1/2002 | Kubo | 428/662 |
| 2002/0020051 | A1 | * | 2/2002 | Wong | 29/599 |
| 2008/0287303 | A1 | * | 11/2008 | Kato et al. | 505/231 |

FOREIGN PATENT DOCUMENTS

| JP | 49-114389 | 2/1973 |
| JP | 4-301322 | 3/1991 |
| JP | 3273953 | 3/1991 |

* cited by examiner

*Primary Examiner*—John P Sheehan
(74) *Attorney, Agent, or Firm*—Stites & Harbison, PLLC; Juan Carlos A. Marquez, Esq.

(57) ABSTRACT

A precursor for manufacturing a $Nb_3Sn$ superconducting wire according to the present invention includes a monoelement wire including a Sn or Sn-based alloy core disposed at the, a Cu or Cu-based alloy matrix and a plurality of Nb or Nb-based alloy filaments surrounding the Sn or Sn-based alloy core, and a diffusion barrier layer and a stabilizing copper layer surrounding the Cu or Cu-based alloy matrix. In a final shape after a reduction process, the average diameter of the Nb or Nb-based alloy filaments is set to 5 μm to 30 μm, and the average distance between the Sn or Sn-based alloy core and the Nb or Nb-based alloy filaments nearest the Sn or Sn-based alloy core is set to 100 μm or less.

3 Claims, 3 Drawing Sheets

PRECURSOR FOR MANUFACTURING NB₃SN SUPERCONDUCTING WIRE AND NB₃SN SUPERCONDUCTING WIRE

BACKGROUND OF THE INVENTION

1. Field of the Invention

The present invention relates to a Nb$_3$Sn superconducting wire manufactured by an internal Sn process, and to a precursor for manufacturing such a Nb$_3$Sn superconducting wire. Specifically, the present invention relates to a technique for manufacturing a Nb$_3$Sn superconducting wire useful as a material of a superconducting magnet for generating a high magnetic field.

2. Description of the Related Art

In the field in which superconducting wires are put into practical use, with respect to superconducting magnets used for high-resolution nuclear magnetic resonance (NMR) spectrometers, nuclear fusion devices, and accelerators, the resolution increases as the generated magnetic field increases. Thus, there has recently been the tendency that magnetic fields generated by superconducting magnets increase more and more.

As a superconducting wire used for superconducting magnets generating a high magnetic field, a Nb$_3$Sn wire has been put into practical use, and a bronze process is mainly utilized for manufacturing such a Nb$_3$Sn superconducting wire.

In the bronze process, a plurality of core materials composed of Nb or a Nb-based alloy is embedded in a Cu—Sn-based alloy (bronze) matrix to form a composite wire. The composite wire undergoes a reduction process such as extrusion or wire drawing, so that the core materials are thinned down to form filaments (hereinafter referred to as "Nb-based filaments"). Next, a plurality of the composite wires each including the Nb-based filaments and the bronze matrix are bundled to form a wire group and then coated with copper for stabilization (stabilizing copper), after which the wire group further undergoes the reduction process. After the reduction process, the above wire group undergoes a heat treatment (diffusion heat treatment) at 600° C. to 800° C., so that a Nb$_3$Sn compound layer is produced at a boundary between the Nb-based filaments and the bronze matrix.

However, the bronze process is disadvantageous in that the solid solubility of Sn in bronze has a limit (15.8% by mass or less), so that the Nb$_3$Sn compound layer has a relatively small thickness, and crystallinity deteriorates to degrade high magnetic properties.

As a method of manufacturing a Nb$_3$Sn superconducting wire other than the bronze process, an internal Sn process is known. Unlike the bronze process, the internal Sn process (also called as an "internal diffusion process") has no limit in terms of Sn concentration due to a solid solubility limit. Therefore, the Sn concentration can be set as high a value as possible, which enables the production of a Nb$_3$Sn layer of high quality, thereby obtaining a high critical current density Jc at a high magnetic field.

In the internal diffusion process, as shown in FIG. 1 (a schematic view of a precursor for manufacturing a Nb$_3$Sn superconducting wire), a core composed of Sn or a Sn-based alloy (hereinafter may be referred to as a "Sn-based metal core") 3 is embedded in the center of a Cu or Cu-based alloy (hereinafter may be referred to as a "Cu matrix") 4. In the Cu matrix 4 surrounding the Sn-based metal core 3, a plurality of core materials composed of Nb or a Nb-based alloy (i.e., "Nb-based filaments") 2 is arranged so as to be spaced from each other, thereby preparing a precursor (a precursor for manufacturing a superconducting wire) 1. The precursor undergoes a wire drawing process and then a heat treatment (diffusion heat treatment), so that Sn in the Sn-based metal core 3 is diffused and reacts with the Nb-based filaments 2, thereby producing Nb$_3$Sn (see Japanese Unexamined Patent Application Publication No. 49-114389).

As shown in FIG. 2, such a precursor 1 generally includes a portion (hereinafter may be referred to as a "superconducting matrix portion") where the Nb-based filaments 2 and the Sn-based metal core 3 are disposed, a stabilizing copper layer 4a provided outside the superconducting matrix portion, and a diffusion barrier layer 6. The diffusion barrier layer 6 is disposed between the matrix portion and the stabilizing copper layer 4a. The diffusion barrier layer 6 is, for example, a Nb layer, a Ta layer, or a double layer including a Nb layer and a Ta layer, and serves to prevent the Sn (Sn-based metal core 3) in the superconducting matrix from diffusing outside during the diffusion heat treatment, thereby enhancing the purity of Sn in the superconducting matrix.

The above-described precursor for manufacturing a superconducting wire is manufactured by following steps: First, Nb-based filaments are inserted into a Cu matrix tube, and the reduction process such as extrusion or wire drawing is performed to form a complex (generally having a hexagonal section) which is then cut into a proper length. Next, a plurality of the complexes is filled into a billet which includes a Cu outer cylinder and is provided with or without the diffusion barrier layer 6. Subsequently, a Cu matrix (Cu solid billet) is disposed in the center of the billet and extrusion is performed. Finally, the Cu matrix in the center is mechanically perforated to prepare a pipe-like complex. Alternatively, a hollow billet which includes a Cu outer cylinder and a Cu inner cylinder and is provided with or without the diffusion barrier layer 6 is filled with a plurality of the above complexes (between the outer cylinder and the inner cylinder). Subsequently, hollow extrusion is performed to prepare a pipe-like complex.

In the gap formed in the center of the pipe-like complex prepared by the above-described process, a Sn-based metal core is inserted and subjected to the reduction process, thereby manufacturing a precursor shown in FIGS. 1 and 2. Hereinafter, the precursor may be referred to as a "mono-element wire".

A plurality of the precursors (mono-element wire) prepared as described above is filled into a Cu matrix tube provided with or without the diffusion barrier layer 6, and then a reduction process is performed to form a precursor for manufacturing a multi-core superconducting wire (hereinafter, may be referred to as a "multi-element wire").

FIGS. 3 and 4 illustrate examples of the multi-element wire. FIG. 3 illustrates a multi-element wire 11 in which a plurality of the precursors 1 (mono-element wire) shown in FIG. 1 are embedded in a Cu matrix 5 provided with a diffusion barrier layer 6a. FIG. 4 illustrates a multi-element wire 11a in which a plurality of the precursors (mono-element wire) shown in FIG. 2 are embedded in a Cu matrix 5 provided without a diffusion barrier layer.

In manufacturing a superconducting wire by the internal diffusion process using the above-described precursors, a technique disclosed in Japanese Patent No. 3273953 is known, for example, as a technique for improving properties (above-described critical current density Jc) of the resulting superconducting wire.

In this technique, for facilitating diffusion of Sn (diffusion from a Sn metal core) into Nb-based filaments, a wire has been proposed, in which in a final cross-sectional shape (sectional shape after the reduction process and before the diffusion heat treatment), the diameter of the Nb-bases filaments is within the range of about 1 to 3 µm, or the average cross-sectional area of the mono-element wire (specifically, superconducting matrix portion) is in the range of 0.0314 mm$^2$ to 0.0019625 mm$^2$. However, the superconducting wire manufactured using such a precursor has the problem of decreasing an n value as one of the superconducting properties.

SUMMARY OF THE INVENTION

The above-described n value is an indicator of uniformity of electrical current flowing through a superconducting wire in the longitudinal direction thereof, or uniformity of a superconducting filament in the longitudinal direction of the wire. It is said that when this n value is increased, the superconducting property (or uniformity of electrical current) is excellent.

As a result of study of conventionally proposed techniques regarding the n value, it was found that a good result has not been always obtained. It has been thought to be effective to reduce as much as possible the diameter of Nb-based filaments in a precursor for manufacturing a superconducting wire, for improving the superconducting properties (especially, critical current density Jc). However, at least in a precursor for the internal diffusion process, a reduction in the diameter of Nb-based filaments causes the problem of reducing the n value as one of the superconducting properties. Due to this situation, the superconducting wire obtained by the internal diffusion process has a difficulty in being used for a magnet of a NMR spectrometer.

The present invention has been achieved under the above-described circumstances. It is therefore an object of the present invention to provide a precursor for manufacturing a Nb$_3$Sn superconducting wire capable of increasing the n value while suitably maintaining the critical current density, and also capable of being used for a superconducting magnet incorporated in a NMR spectrometer. It is another object of the present invention to provide a Nb$_3$Sn superconducting wire including such a precursor, for achieving excellent superconducting properties.

In order to achieve the objects, in an aspect of the present invention, a precursor for manufacturing a Nb$_3$Sn superconducting wire includes a mono-element wire used for manufacturing a Nb$_3$Sn superconducting wire by the internal Sn process. The mono-element wire includes a Sn or Sn-based alloy core disposed at the center, a Cu or Cu-based alloy matrix and a plurality of Nb or Nb-based alloy filaments surrounding the Sn or Sn-based alloy core, and a diffusion barrier layer and a stabilizing copper layer surrounding the Cu or Cu-based alloy matrix. The average diameter of the Nb or Nb-based alloy filaments in a final shape after the reduction process is set to 5 µm to 30 µm, and the average distance between the Sn or Sn-based alloy core and the Nb or Nb-based alloy filaments nearest the Sn or Sn-based alloy core is set to 100 µm or less.

The structure of the above-described precursor corresponds to a mono-element wire (its basic structure is shown in FIG. 2). However, the precursor for manufacturing a superconducting wire according to the present invention may include a multi-element wire including a plurality of the mono-element wires (its basic structure is shown in FIGS. 3 and 4).

In another aspect of the present invention, a precursor for manufacturing a superconducting wire includes a multi-element wire used for manufacturing a Nb$_3$Sn superconducting wire by the internal Sn process. The multi-element wire includes a plurality of mono-element wires each including a Sn or Sn-based alloy core disposed at the center, and a Cu or Cu-based alloy matrix and a plurality of Nb or Nb-based alloy filaments surrounding the Sn or Sn-based alloy core, and a diffusion barrier layer and a stabilizing copper layer surrounding the plurality of mono-element wires. The average diameter of the Nb or Nb-based alloy filaments in a final shape after the reduction process is set to 5 µm to 30 µm, and the average distance between the Sn or Sn-based alloy core and the Nb or Nb-based alloy filaments nearest the Sn or Sn-based alloy core is set to 100 µm or less.

In a further aspect of the present invention, a multi-element wire used for manufacturing a Nb$_3$Sn superconducting wire includes a plurality of mono-element wires each including a Sn or Sn-based alloy core disposed at the center, a Cu or Cu-based alloy matrix and a plurality of Nb or Nb-based alloy filaments surrounding the Sn or Sn-based alloy core, and a diffusion barrier layer and a stabilizing copper layer surrounding the Cu or Cu-based alloy matrix, and a stabilizing copper layer surrounding the plurality of mono-element wires. The average diameter of the Nb or Nb-based alloy filaments in a final shape after the reduction process is set to 5 µm to 30 µm, and the average distance between the Sn or Sn-based alloy core and the Nb or Nb-based alloy filaments nearest the Sn or Sn-based alloy core is set to 100 µm or less.

In a diffusion heat treatment of the precursor for manufacturing a superconducting wire including the above-described mono-element wire or multi-element wire, a Nb$_3$Sn superconducting wire having desired superconducting properties (critical current density Jc and n value) can be manufactured.

According to the present invention, the diameter of the Nb-based filaments in the superconducting matrix is relatively increased, and the distance between the Sn or Sn-based alloy core and the Nb-based filaments nearest the Sn or Sn-based alloy core is decreased as much as possible. It is thus possible to realize a precursor for manufacturing a Nb$_3$Sn superconducting wire, which is capable of manufacturing a superconducting wire having improved critical current density Jc and n value.

DESCRIPTION OF THE PREFERRED EMBODIMENTS

Figure 1:
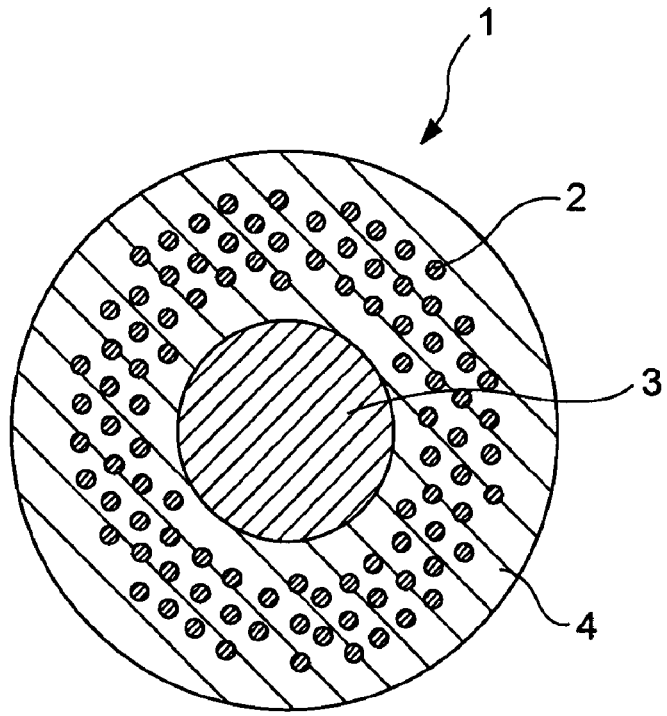
FIG. 1 is a sectional view schematically illustrating an example of the structure of a precursor for manufacturing a superconducting wire (mono-element wire) by the internal diffusion process.

The inventors studied from various perspectives to achieve the above objects of the present invention. As a result, it was found that, in a mono-element wire shown in FIG. 2 or a multi-element wire shown in FIG. 3 or 4, an n value can be increased by increasing the diameter of Nb-based filaments in a step of forming a final cross-sectional shape (after a reduction process) as compared with a usual diameter. It was also found that a critical current density Jc can be enhanced by reducing as much as possible the average distance between a Sn or Sn-based alloy core and the Nb-based filaments nearest the Sn or Sn-based alloy core. On the basis of these findings, the present invention has been completed.

As described above, in the manufacture of a superconducting wire by the internal Sn process, it has been thought to be effective to reduce as much as possible the diameter of Nb-based filaments, for improving superconducting properties. However, in such a structure, the n value as one of the superconducting properties is adversely affected. As a result of various studies on the reason for this, the following finding was obtained.

With a precursor for the bronze process, because of its structure, several times of intermediate annealing can be performed in the reduction process. On the other hand, in the internal Sn process, because of the position of the Sn-based metal core at the center of the wire, the intermediate annealing as described above is not performed after positioning the Sn-based alloy core, and the reduction process is mainly performed only in a cold work. Thus, in a precursor for manufacturing a superconducting wire by the internal Sn process, work hardening of Nb-based filaments occurs during the reduction process, and the reduction process until the Nb-based filaments are reduced in size impairs the uniformity in diameter of the filaments in the longitudinal direction in comparison with a precursor for the bronze process. Therefore, it has been thought that the n value of a superconducting wire manufactured by the internal Sn process cannot be easily improved.

Thus, the inventors studied a structure for increasing as much as possible the n value of a precursor for manufacturing a superconducting wire by the internal Sn process. As a result, it was found that by setting the average diameter of Nb-based filaments to be 5 μm to 30 μm in a final sectional shape (sectional shape after the reduction process), the Nb-based filaments can have a uniform shape in the longitudinal direction, thereby contributing to an increase in the n value of a superconducting wire.

That is, when the diameter of the Nb-based filaments is reduced to less than 5 μm only by a cold process after the Sn-based metal core is inserted, the n value is reduced due to nonuniform deformation of the Nb-bases filaments, and further, a possibility of internal disconnection in the Nb-based filaments or wire breakage or breakage of the wire is increased. On the other hand, when the diameter of the Nb-bases filaments exceeds 30 μm, the critical current density Jc is reduced. Thus, the average diameter of the Nb-based filaments preferably has a lower limit of 10 μm and an upper limit of 15 μm. However, all Nb-based filaments of the precursor of the present invention do not necessarily have a diameter within the above-described range. Even if a part of the filaments have a diameter slightly beyond the above-described range, the above-described effect can be obtained when the average diameter of all filaments is set to fall in the above-described range.

The critical current density Jc tends to decrease as the diameter of the Nb-based filaments increases. However, in the precursor according to the present invention, in order to prevent a reduction in the current density Jc, the shortest distance between the Sn-based metal core and the Nb-based filaments in the final sectional shape is set to be 100 μm or less. Such a structure will be described below with reference to the drawings.

Figure 5:
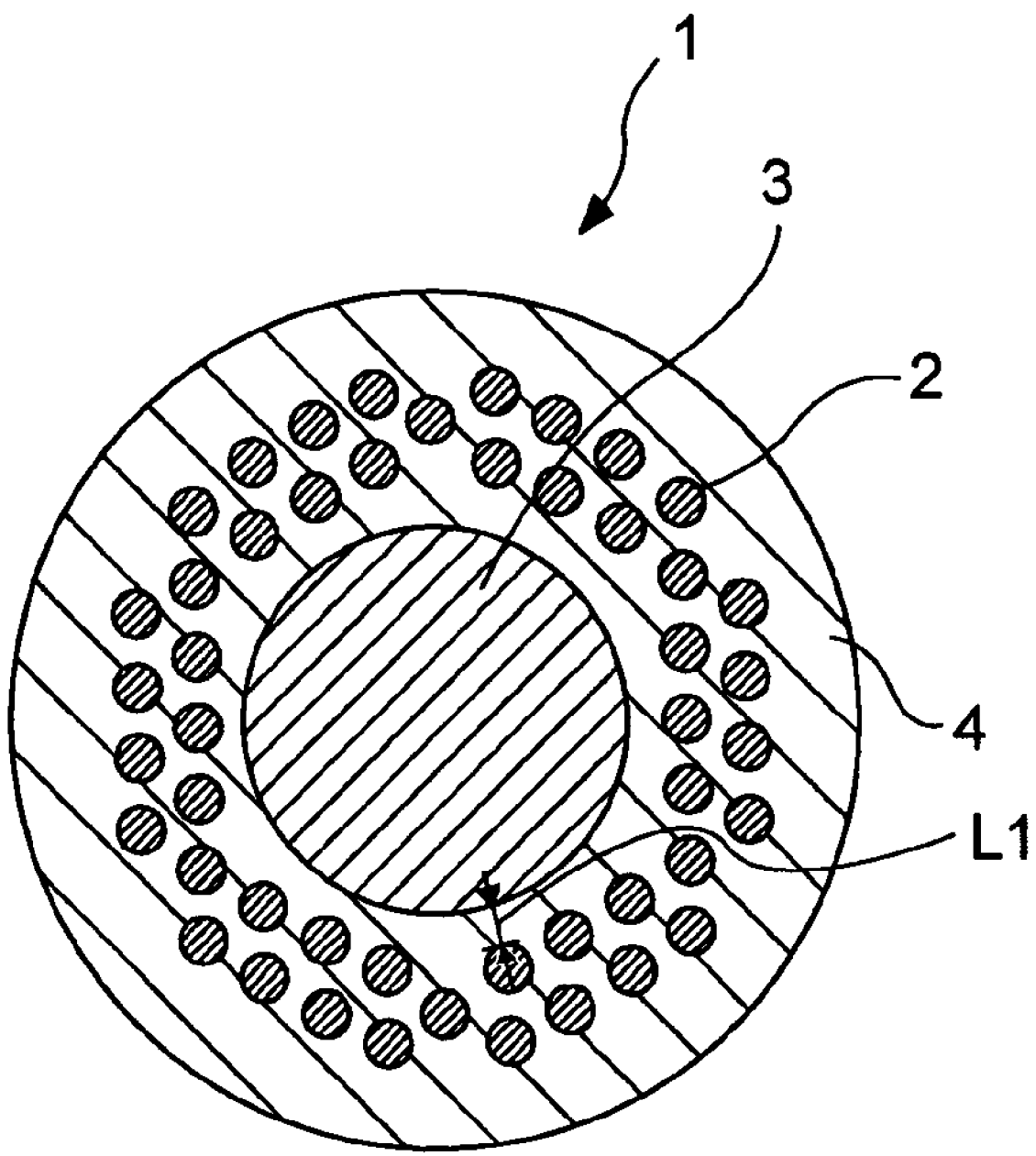
FIG. 5 is a sectional view schematically illustrating an example of the structure of a precursor for manufacturing a superconducting wire (mono-element wire) according to the present invention.

FIG. 5 is a sectional view schematically illustrating an example of the structure of a precursor (mono-element wire) according to the present invention. The basic structure is similar to that shown in FIG. 1, and portions corresponding to those shown in FIG. 1 are denoted by the same reference numerals. Note that the mono-element wire according to the present invention includes a diffusion barrier layer and a stabilizing copper layer disposed on the outer periphery of a superconducting matrix (see FIG. 2), however, in FIG. 5, these layers are omitted for the convenience of description.

For the precursor according to the present invention, it is important that in the final shape (the final sectional shape after the reduction process), an average of the distances L1 between a Sn-based metal core 3 and Nb-based filaments 2 nearest (the innermost side in the radial direction) the Sn-based metal core 3 is set to 100 μm or less. Thus, the thickness of a Cu matrix present in this area is reduced, so that Sn diffusion from the Sn metal core 3 to the Nb-based filaments 2 is facilitated, and thus the production rate of a $Nb_3Sn$ phase is increased, thereby increasing the critical current density Jc of the resulting superconducting wire.

The average distance between the Sn-based metal core 3 and the Nb-based filaments 2 nearest the Sn-based metal core 3 is an average value of the distances L1 (see FIG. 5) between the Sn-based metal core 3 and the Nb-based filaments nearest the Sn-based metal core 3 (i.e., at the inner side in the radial direction), among the Nb-based filaments 2 disposed in the Cu matrix. However, all Nb-based filaments present at the inner side in the radial direction need not necessarily satisfy the requirement that the distance L1 be 100 μm or less. The distances L1 of the nearest Nb-based filaments are often nonuniform, and thus it is sufficient that the distances L1 of at least 50% or more of the Nb-based filaments present at the innermost side in the radial direction is 100 μm or less, and the average distance of all Nb-based filaments is 100 μm. However, it is preferred that all Nb-based filaments present at the innermost side in the radial direction satisfy the requirement that the distance L1 be 100 μm or less.

The average distance between the Sn-based metal core 3 and the Nb-based filaments 2 nearest the Sn-based metal core 3 is preferably 50 μm or less. However, if the Nb-based filaments 2 come into contact with the Sn-based metal core 3, the Nb-based filaments 2 may shift into the Sn-based alloy when the Sn-based metal core 3 disposed at the center is melted in the heat treatment. Thus, such contact is preferably avoided as much as possible (i.e., the distance L1 does not include zero). The average distance between the Sn-based metal core 3 and the Nb-based filaments 2 nearest the Sn-based metal core 3 may be about 5 μm or 10 μm.

FIG. 5 shows the structure of a mono-element wire, but a multi-element wire also satisfies the requirements defined in the present invention. In other words, the objects of the present invention can be achieved by setting the average diameter of the Nb-based filaments in the final shape after the reduction process to 5 to 30 μm and by setting the above-described average distance to 100 μm or less in any one of the following multi-element wires: (A) a multi-element wire manufactured by bundling a plurality of multi-element wires having the structure shown in FIG. 5 and providing a diffusion barrier layer and a stabilizing layer on the outer periphery of a bundle of the multi-element wires (see FIG. 3), and (B) a multi-element wire manufactured by bundling a plurality of mono-element wires having the structure shown in FIG. 5, each including a diffusion barrier layer and a stabilizing copper layer disposed on its outer periphery, and providing a stabilizing copper layer on the outer periphery of a bundle of the mono-element wires.

In the precursor according to the present invention, the Nb-based filaments need to be disposed without contacting each other. However, in view of exhibiting satisfactory superconducting properties, the distance between the respective Nb-based filaments is preferably 0.05 to 0.30 times as large as the average diameter of the Nb-based filaments. If the distance is less than 0.05 times, Sn cannot be sufficiently diffused and thus the critical current density Jc is lowered, while if the distance is more than 0.30 times, the area of a $Nb_3Sn$ produced layer is reduced and thus the critical current density Jc is also lowered.

The precursor according to the present invention basically includes Nb-based filaments (each including a Nb of Nb-based alloy) and a Sn-based metal core (Sn or Sn-based alloy core), both of which are disposed in a Cu or Cu-based alloy matrix. The Cu alloy used as a material contains Cu and an element such as Nb or Ni (about 5% by mass). The Sn-based alloy used as the Sn-based metal core contains Sn and an element such as Ti, Ta, Zr, or Hf in an amount not impairing the workability (about 5% by mass or less). Further, the Nb-based alloy used for the Nb-based filaments contains Nb and an additive element such as Ta, Hf, or Zr in an amount up to about 10% by mass.

In the method according to the present embodiment, a diffusion heat treatment (generally at about 200° C. to less than 800° C.) including a bronzing heat treatment of the above-described precursor can produce a $Nb_3Sn$ superconducting wire having excellent superconducting properties (critical current density Jc and n value). Specifically, the bronzing heat treatment (diffusing Sn into Cu) is performed in the temperature range of 180° C. to 600° C., and then the heat treatment for producing $Nb_3Sn$ is performed in the temperature range of 650° C. to 750° C. for 100 to 200 hours. The bronzing heat treatment may include a combination of heat treatment steps at 180° C. to 200° C. for about 50 hours, at about 340° C. for 50 hours, and at about 550° C. for 50 to 100 hours, for example.

The present invention will be described in further detail below with reference to examples. However, the present invention is not limited to these examples and may be properly modified within the scopes of the preceding description and the following description, and all such modifications are included in the technical scope of the present invention.

EXAMPLES

Example 1

A Nb-1 mass % Ti alloy core having an external diameter of 17 mm was inserted into a Cu pipe having an external diameter of 21 mm and an internal diameter of 18 mm, and then subjected to the reduction process to form a Cu/Nb—Ti composite wire with a hexagonal sectional shape (hexagon opposite side distance: 4.3 mm). The composite wire was cut into a length of 400 mm.

On the other hand, a Cu hollow billet including a Cu outer cylinder (external diameter: 143 mm, internal diameter: 125 mm) and a Cu inner cylinder (external diameter: 70 mm, internal diameter: 61 mm) was prepared.

Then, a diffusion barrier layer composed of Nb (thickness: 5 mm) was provided on the inner surface of the Cu outer cylinder of the Cu hollow billet. Next, a bundle of 336 Cu/Nb—Ti composite wires was provided around the Cu inner cylinder (i.e., the space between the Cu outer cylinder and the Cu inner cylinder). Then, the Cu hollow billet in which the Cu/Nb—Ti composite wires had been inserted was covered and evacuated, followed by welding of the cover.

The resulting billet was subjected to a hollow extrusion process, and then a Sn metal core was inserted into the Cu inner cylinder and further subjected to wire drawing to prepare a mono-element wire having a hexagonal sectional shape (hexagon opposite side distance: 3.5 mm).

Figure 4:
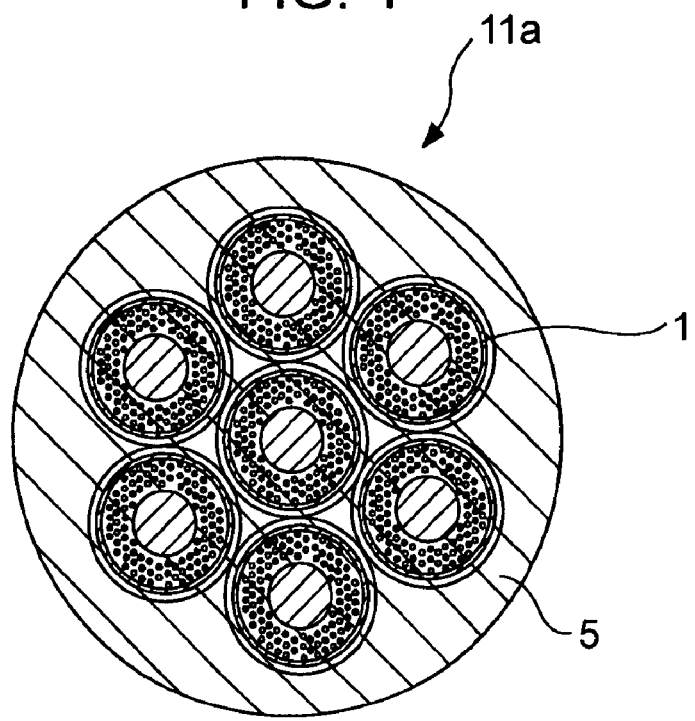
FIG. 4 is a sectional view schematically illustrating another example of the structure of a precursor for manufacturing a superconducting wire (multi-element wire) by the internal diffusion process.

Next, the mono-element wire was cut, and a bundle of 19 mono-element wires was inserted into a Cu pipe (external diameter: 21 mm, internal diameter: 18 mm) and subjected to a wire drawing process to form a multi-element wire (a precursor for manufacturing a superconducting wire) having an external diameter of 1.0 mm or 2.0 mm (see FIG. 4).

The both resulting multi-element wires were heat-treated (diffusion heat treatments) at 550° C. for 100 hours and at 700° C. for 100 hours to prepare a $Nb_3Sn$ superconducting wire. With respect to the resultant $Nb_3Sn$ superconducting wire, the critical current density (Jc) and the n value were measured under the following conditions. Further, in the wire before the heat treatment, the diameter (average diameter) of the Nb-based filaments (Nb-1 mass % Ti alloy filaments) and the average distance between the Sn metal core and the Nb-based filaments nearest the Sn metal core were calculated by the following methods.

[Measurement of Critical Current Density Jc]

In liquid helium (temperature of 4.2K), an electric current was supplied to a sample (superconducting wire) under an external magnetic field of 16 T (Tesla) to measure a generated voltage by a four-terminal method. When an electrical field of 0.1 µV/cm was produced, an electric current (critical current Ic) was measured. The measured value was divided by the sectional area of the non-Cu portion of the wire to determine the critical current density Jc.

[Measurement of n Value]

In a (Ic-V) curve obtained by the same measurement as for determining the critical current, data between 0.1 µV/cm and 1.0 µV/cm was indicated in a log-log graph, and an n value was obtained from the gradient. A relationship between the current and the voltage can be empirically expressed by an approximate expression such as the following expression (1). The n value was determined according to the expression.

$$V = Vc(Iop/Ic)n \qquad (1)$$

wherein Iop and Ic represent the operation current of a superconducting magnet and the critical current of a wire, respectively, and Vc represents a reference voltage for defining Ic.

[Calculation of Average Diameter of Nb-Based Filament]

The diameters of ten Nb filaments in 1/6 of an element of the wire were measured in its central portion and outer periphery of a sectional area by observation through a scanning electron microscope (SEM). Then, an average of the diameters was regarded as the average diameter of the Nb filaments.

[Calculation of Average Distance between Sn Metal Core and Nb-Based Filament Nearest the Sn Metal Core]

The shortest distances L1 between the Nb-based filaments and the Sn metal core in one element of the wire was measured in its central portion and outer periphery of a sectional area by observation through a scanning electron microscope (SEM) to determine the average distance.

Example 2

A Cu/Nb-1 mass % Ti composite wire having a hexagonal sectional shape (hexagon opposite side distance: 2.0 mm) was formed and cut into a length of 400 mm by the same method as in Example 1.

On the other hand, a Cu hollow billet including a Cu outer cylinder (external diameter: 143 mm, internal diameter: 125 mm) and a Cu inner cylinder (external diameter: 70 mm, internal diameter: 61 mm) was prepared.

Then, a diffusion barrier layer composed of Nb (thickness: 5 mm) was provided on the inner surface of the Cu outer cylinder of the Cu hollow billet. Next, a bundle of 1602 Cu/Nb—Ti composite wires was provided around the Cu inner cylinder (i.e., the space between the Cu outer cylinder and the Cu inner cylinder). Then, the Cu hollow billet in which the Cu/Nb—Ti composite wires had been inserted was covered and evacuated, followed by welding of the cover.

Figure 2:
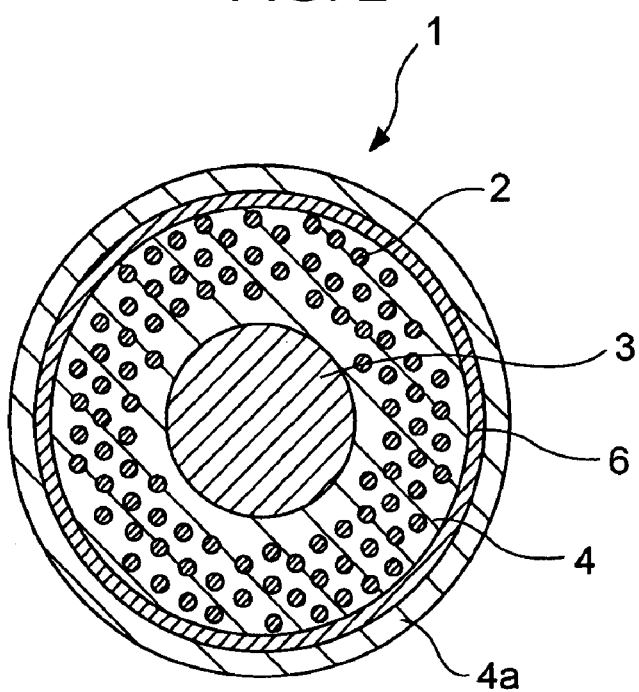
FIG. 2 is a sectional view schematically illustrating another example of the structure a precursor for manufacturing a superconducting wire (mono-element wire) by the internal diffusion process.
Figure 3:
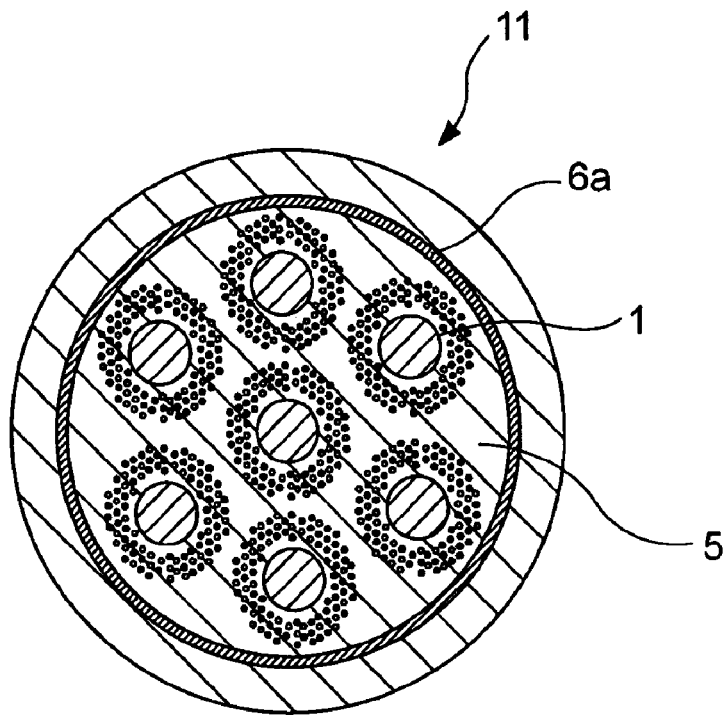
FIG. 3 is a sectional view schematically illustrating an example of the structure of a precursor for manufacturing a superconducting wire (multi-element wire) by the internal diffusion process.

The resulting billet was subjected to a hollow extrusion process, and then a Sn metal core was inserted into the Cu inner cylinder and further subjected to wire drawing to prepare a mono-element wire having an outer diameter of 1.5 mm (precursor for manufacturing a superconducting wire) (see FIG. 2).

The resulting mono-element wire was heat-treated (diffusion heat treatments) at 550° C. for 50 hours and at 700° C. for 100 hours to prepare a $Nb_3Sn$ superconducting wire. With respect to the resulting $Nb_3Sn$ superconducting wire, the critical current density (Jc) and n value were measured under the same conditions as in Example 1. Further, in the wire before the heat treatment, the average diameter of the Nb-based filaments (Nb-1 mass % Ti alloy filaments) and the average distance between the Sn metal core and the Nb-based filaments nearest the Sn metal core were calculated by the same method as in Example 1.

Example 3

A Cu/Nb-1 mass % Ti composite wire having a hexagonal sectional shape (hexagon opposite side distance: 2.0 mm) was formed and cut into a length of 400 mm by the same method as in Example 1.

On the other hand, a Cu hollow billet including a Cu outer cylinder (external diameter: 143 mm, internal diameter: 125 mm) and a Cu inner cylinder (external diameter: 67.5 mm, internal diameter: 61 mm) was prepared.

Then, a diffusion barrier layer composed of Nb (thickness: 5 mm) was provided on the inner surface of the Cu outer cylinder of the Cu hollow billet. Next, a bundle of 1686 Cu/Nb—Ti composite wires was provided around the Cu inner cylinder (i.e., the space between the Cu outer cylinder and the Cu inner cylinder). Then, the Cu hollow billet in which the Cu/Nb—Ti composite wires had been inserted was covered and evacuated, followed by welding of the cover.

The resulting billet was subjected to a hollow extrusion process, and then a Sn metal core was inserted into the Cu inner cylinder and further subjected to wire drawing to prepare a mono-element wire having an outer diameter of 2.2 mm (precursor for manufacturing a superconducting wire) (see FIG. 2).

The resulting mono-element wire was heat-treated (diffusion heat treatments) at 550° C. for 100 hours and at 700° C. for 100 hours to prepare a $Nb_3Sn$ superconducting wire. With respect to the resulting $Nb_3Sn$ superconducting wire, the critical current density (Jc) and n value were measured under the same conditions as in Example 1. Further, in the wire before the heat treatment, the average diameter of the Nb-based filaments (Nb-1 mass % Ti alloy filaments) and the average distance between the Sn metal core and the Nb-based filaments nearest the Sn metal core were calculated by the same method as in Example 1.

Comparative Example 1

A hollow billet prepared by the same method as in Example 2 was subjected to a hollow extrusion process, and then a Sn metal core was inserted into the Cu inner cylinder and further subjected to wire drawing to prepare a mono-element wire having an outer diameter of 2.2 mm (precursor for manufacturing a superconducting wire) (see FIG. 2).

The resulting mono-element wire was heat-treated (diffusion heat treatments) at 550° C. for 50 hours and at 700° C. for 100 hours to prepare a $Nb_3Sn$ superconducting wire.

With respect to the resulting $Nb_3Sn$ superconducting wire, the critical current density (Jc) and n value were measured under the same conditions as in Example 1. Further, in the wire before the heat treatment, the average diameter of the Nb-based filaments (Nb-1 mass % Ti alloy filaments) and the average distance between the Sn metal core and the Nb-based filaments nearest the Sn metal core were calculated by the same method as in Example 1.

Comparative Example 2

A Cu/Nb—Ti composite wire having a hexagonal sectional shape (hexagon opposite side distance: 2.0 mm) was formed and cut into a length of 400 mm by the same method as in Example 1.

On the other hand, a Cu hollow billet including a Cu outer cylinder (external diameter: 143 mm, internal diameter: 125 mm) and a Cu inner cylinder (external diameter: 65.5 mm, internal diameter: 61 mm) was prepared.

Then, a diffusion barrier layer composed of Nb (thickness: 5 mm) was provided on the inner surface of the Cu outer cylinder of the Cu hollow billet. Next, a bundle of 1758 Cu/Nb—Ti composite wires was provided around the Cu inner cylinder (i.e., the space between the Cu outer cylinder and the Cu inner cylinder). Then, the Cu hollow billet in which the Cu/Nb—Ti composite wires had been inserted was covered and evacuated, followed by welding of the cover.

The resulting billet was subjected to a hollow extrusion process, and then a Sn metal core was inserted into the Cu inner cylinder and further subjected to wire drawing to prepare a mono-element wire having an outer diameter of 3.0 mm (precursor for manufacturing a superconducting wire) (see FIG. 2).

The resulting mono-element wire (external diameter: 3.0 mm) was heat-treated (diffusion heat treatments) at 550° C. for 50 hours and at 700° C. for 100 hours to prepare a $Nb_3Sn$ superconducting wire.

With respect to the resulting $Nb_3Sn$ superconducting wire, the critical current density (Jc) and n value were measured under the same conditions as in Example 1. Further, in the wire before the heat treatment, the average diameter of the Nb-based filaments (Nb-1 mass % Ti alloy filaments) and the average distance between the Sn metal core and the Nb-based filaments nearest the Sn metal core were calculated by the same method as in Example 1.

Comparative Example 3

A Cu/Nb—Ti composite wire having a hexagonal section shape (hexagon opposite side distance: 2.0 mm) was formed and cut into a length of 400 mm by the same method as in Example 1.

On the other hand, a Cu hollow billet including a Cu outer cylinder (external diameter: 143 mm, internal diameter: 127 mm) and a Cu inner cylinder (external diameter: 68 mm, internal diameter: 61 mm) was prepared.

Then, a diffusion barrier layer composed of Nb (thickness: 5 mm) was provided on the inner surface of the Cu outer cylinder of the Cu hollow billet. Next, a bundle of 1674 Cu/Nb—Ti composite wires was provided around the Cu inner cylinder (i.e., the space between the Cu outer cylinder and the Cu inner cylinder). Then, the Cu hollow billet in which the Cu/Nb—Ti composite wires had been inserted was covered and evacuated, followed by welding of the cover.

The resulting billet was subjected to a hollow extrusion process, and then a Sn metal core was inserted into the Cu inner cylinder and further subjected to wire drawing to prepare a mono-element wire having an outer diameter of 3.0 mm (precursor for manufacturing a superconducting wire) (see FIG. 2).

The resulting mono-element wire (external diameter: 3.0 mm) was heat-treated (diffusion heat treatments) at 550° C. for 50 hours and at 700° C. for 100 hours to prepare a $Nb_3Sn$ superconducting wire.

With respect to the resulting $Nb_3Sn$ superconducting wire, the critical current density (Jc) and n value were measured under the same conditions as in Example 1. Further, in the wire before the heat treatment, the average diameter of the Nb-based filaments (Nb-1 mass % Ti alloy filaments) and the average distance between the Sn metal core and the Nb-based filaments nearest the Sn metal core were calculated by the same method as in Example 1.

Comparative Example 4

A mono-element wire having a hexagonal sectional shape (hexagon opposite side distance: 2.1 mm) was prepared by the same method as in Example 1. The composite wire was cut, and then a bundle of 55 composite wires was inserted in a Cu pipe (external diameter: 21 mm, internal diameter: 18 mm) to prepare a composite wire. The resulting composite wire was subjected to a reduction process to prepare a multi-element wire having an outer diameter of 1.0 mm (precursor for manufacturing a superconducting wire) (see FIG. 4).

The resulting multi-element wire was heat-treated (diffusion heat treatments) at 550° C. for 50 hours and at 700° C. for 100 hours to prepare a $Nb_3Sn$ superconducting wire.

With respect to the resulting $Nb_3Sn$ superconducting wire, the critical current density (Jc) and n value were measured under the same conditions as in Example 1. Further, in the wire before the heat treatment, the average diameter of the Nb-based filaments (Nb-1 mass % Ti alloy filaments) and the average distance between the Sn metal core and the Nb-based filaments nearest the Sn metal core were calculated by the same method as in Example 1.

The superconducting properties (critical current density Jc and n value) of the superconducting wires obtained in Examples 1 to 3 and Comparative Examples 1 to 4 are summarized in Table 1, together with the average diameter of the Nb-based filaments, the average distance between the Sn metal core and the Nb-based filaments nearest the Sn metal core, and the distance between the respective Nb-based filaments. In Table 1, the standard superconducting properties (Jc and n value) of a superconducting wire manufactured by the bronze process (manufacturing condition: using a Cu-15 mass % Sn-0.3 mass % Ti alloy) are also shown as reference values.

TABLE 1

|  | Wire diameter (mm) | Average diameter of Nb-based filament (μm) | Average distance between Sn metal core and Nb-based Filament nearest the Sn metal core | Critical current density Jc (A/mm$^2$) | n Value | Distance between Nb-based filaments (μm) |
|---|---|---|---|---|---|---|
| Example 1 | 1.0 | 6 | 20 | 803 | 61 | 1 |
|  | 2.0 | 11 | 45 | 722 | 73 | 2 |
| Example 2 | 1.5 | 20 | 70 | 675 | 82 | 3.5 |
| Example 3 | 2.2 | 29 | 70 | 580 | 79 | 5 |
| Comparative Example 1 | 2.2 | 29 | 105 | 410 | 83 | 5 |
| Comparative Example 2 | 3.0 | 40 | 70 | 375 | 80 | 7 |
| Comparative Example 3 | 3.0 | 40 | 110 | 303 | 85 | 7 |
| Comparative Example 4 | 1.0 | 3 | 10 | 924 | 30 | 0.5 |
| Bronze Process | — | — | — | 320 | 55 | — |

The results shown in Table 1 indicate that in Examples 1 to 3 satisfying the requirements defined in the present invention, a satisfactory n value and critical current density Jc are obtained. It is necessary that the critical current density Jc is at least 550 A/mm$^2$ or more and preferably 650 A/mm$^2$ or more, and the n value is 50 or more and preferably 60 or more.

What is claimed is:

1. A precursor for manufacturing a $Nb_3Sn$ superconducting wire by an internal Sn process, the precursor comprising:
   a multi-element wire having a center portion including a plurality of mono-element wires;
   each of said plurality of mono-element wires having a Cu or Cu-based alloy matrix into which an Sn or Sn-based alloy core is embedded, and having a plurality of Nb or Nb-based alloy filaments surrounding the Sn or Sn-based alloy core, said plurality of Nb or Nb-based alloy filaments configured to have an average distance from the outer diameter of the Sn or Sn-based alloy core of 100 μm or less; and at least one of said plurality of Nb or Nb-based alloy filaments configured to have a distance from the outer diameter of the Sn or Sn-based alloy core of 50 μm or less; and said plurality of Nb or Nb-based alloy filaments having an average diameter of 5 μm to 30 μm, and a diffusion barrier layer surrounding said plurality of Nb or Nb-based alloy filaments; and a stabilizing copper layer surrounding each of said mono-element wires.

2. The precursor according to claim 1, wherein the plurality of Nb or Nb-based alloy filaments is disposed in the Cu or Cu-based alloy matrix so as not to contact each other, and the distance between the respective Nb or Nb-based alloy filaments is 0.05 to 0.30 times as large as the average diameter of the filaments.

3. A $Nb_3Sn$ superconducting wire wherein the precursor according to claim 1 is heat-treated to form a $Nb_3Sn$ superconducting phase.

* * * * *